United States Patent
Ono et al.

(10) Patent No.: US 7,868,699 B2
(45) Date of Patent: Jan. 11, 2011

(54) SEMICONDUCTOR INTEGRATED CIRCUIT DEVICE

(75) Inventors: Hideyuki Ono, Tokyo (JP); Toru Fujioka, Tokyo (JP); Masahito Numanami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 243 days.

(21) Appl. No.: 12/179,716

(22) Filed: Jul. 25, 2008

(65) Prior Publication Data

US 2008/0287090 A1    Nov. 20, 2008

Related U.S. Application Data

(63) Continuation of application No. 11/431,534, filed on May 11, 2006, now Pat. No. 7,411,457.

(30) Foreign Application Priority Data

May 13, 2005   (JP) ............................. 2005-141069

(51) Int. Cl.
    *H03F 3/191*    (2006.01)
(52) U.S. Cl. ...................................................... 330/302
(58) Field of Classification Search ................ 330/285, 330/302
    See application file for complete search history.

(56) References Cited

U.S. PATENT DOCUMENTS

| 4,890,069 A | 12/1989 | Duffalo et al. |
| 5,051,706 A * | 9/1991 | Zushi .......................... 330/277 |

FOREIGN PATENT DOCUMENTS

JP         5-37257 A      2/1993

* cited by examiner

*Primary Examiner*—Steven J Mottola
(74) *Attorney, Agent, or Firm*—Mattingly & Malur, P.C.

(57) ABSTRACT

The present invention is to provide a technique which optimizes a gate resistor of a bias circuit to thereby make it possible to greatly improve a distortion characteristic of a power amplifier. A bias circuit used as for biasing the gate of a final-stage power transistor is included in a power amplifier provided in a communication mobile system. In the bias circuit, an inductance and a resistor are series-connected between a power supply voltage and the gate of the power transistor. The resistance value of the resistor is set to approximately the same order as an input impedance of the power transistor. When the input impedance of the power transistor is about 10Ω or so, for example, the resistor is set to about a few Ω to about 100Ω. Thus, the gain of the power transistor at a low-frequency band can greatly be suppressed.

6 Claims, 9 Drawing Sheets

SEMICONDUCTOR INTEGRATED CIRCUIT DEVICE

CROSS-REFERENCE TO RELATED APPLICATION

This is a continuation application of U.S. Ser. No. 11/431,534, filed May 11, 2006, now U.S. Pat. No. 7,411,457. The present application claims priority from Japanese application No. 2005-141069 filed on May 13, 2005, the content of which is hereby incorporated by reference into this application.

BACKGROUND OF THE INVENTION

The present invention relates to a technique for amplifying a transmit signal, which is employed in mobile communication equipment, and particularly to a technique effective in improving a distortion characteristic of a power amplifier for amplifying a transmit signal, which is based on a third-generation mobile communication system.

A cellular phone has recently been widely prevalent as one for one mobile communication. There has been a demand for diversity even with respect to its function. A power amplifier for power amplification in an RF (high-frequency) module used in the cellular phone requires high efficiency, high linearity, etc. to transmit more information in a short period of time as in an extension of a communication time, a transfer of image information, etc.

For example, a power amplifier typified by a communication system of GSM (Global System for Mobile Communication) comprises a power FET (Field Effect Transistor) nearest to an antenna, an FET for a driver, impedance matching circuits, gate bias circuits and drain bias circuits, etc.

The impedance matching circuits are provided on the input and output sides. Further, the impedance matching circuit is provided between the power FET and the FET for the driver. The gate bias circuits respectively apply bias voltages to the gates of the power FET and the FET for the driver. The drain bias circuits respectively apply bias voltages to the drains of the power FET and the FET for the driver.

In the power amplifier, the positions and capacitance values of electrostatic capacitive elements constituting the impedance matching circuits, and the inductance values of inductors, etc. are adjusted to optimize impedance matching. Then, a propagated harmonic signal is trapped to set input-output characteristics for the purpose of making satisfaction thereof, whereby an improvement in distortion characteristic is made.

SUMMARY OF THE INVENTION

It has however been found out by the present inventors that the above technique of improving the distortion characteristic at the power amplifier involves the following problems.

That is, while the power FET in the power amplifier is being used as a saturated amplifier, a third-generation mobile communication system for WCDMA (Wideband Code Division Multiple Access), cdma2000 or the like considered to become mainstream from now on needs a linear amplifier in order to perform digital modulation. An improvement in distortion characteristic is most important for the linear amplifier.

According to the discussions of the present inventors, each of the gate bias circuits comprises a configuration in which a gate resistor and an inductance such as a microsplit line or the like are connected in series. A capacitor connected to a reference potential is connected to a connecting part of the gate resistor and the inductance.

A bias voltage adjusted to an arbitrary bias current is connected to one connecting part of the gate resistor. As the gate resistor, a resistor having a high resistance value of 10 kΩ or so, for example, is generally used to avoid leakage of a high-frequency signal into a bias circuit.

However, the gate bias circuit having such a configuration does not take into consideration at all, an improvement in distortion characteristic by an improvement in the gate bias circuit. Also a problem arises in that adaptations or countermeasures based on only tuning by the settings of the impedance matching circuits cannot provide a sufficient improvement in distortion characteristic.

An object of the present invention is to provide a technique which optimizes a gate resistor of a bias circuit to thereby make it possible to greatly improve a distortion characteristic of a power amplifier.

The above, other objects and novel features of the present invention will become apparent from the description of the present specification and the accompanying drawings.

A summary of a typical or representative one of the inventions disclosed in the present application will briefly be explained as follows:

The present invention provides a semiconductor integrated circuit device suitable for use in mobile communication equipment, comprising a high-frequency power amplifier including: a transistor constituted of an FET or the like provided at a final stage of the high-frequency power amplifier, the transistor having a gate inputted with a transmit signal, a source connected with a reference potential and a drain which outputs a signal obtained by amplifying the transmit signal; a first bias circuit which supplies a bias voltage to the drain of the transistor; and a second bias circuit which supplies a bias voltage to the gate of the transistor, wherein the second bias circuit includes a gate resistor and an inductance series-connected between a bias power supply voltage and the gate of the transistor, and wherein the gate resistor has a resistance value of substantially the same order as an input impedance of the transistor at a carrier frequency thereof, which is determined by the sum of a gate capacitance of the transistor and a feedback capacitance thereof.

A summary of other invention of the present application will be shown briefly.

In the present invention, the transmit signal inputted to the high-frequency power amplifier is digital-modulated by a communication system of any of WCDMA, CDMA2000, and EDGE (Enhanced Data rates for GSM Evolution), and the high-frequency power amplifier performs a linear operation.

In the present invention, the gate resistor comprises a resistance value of less than or equal to 100Ω or so.

In the present invention, the bias circuit has an electrostatic capacitive element connected between the bias power supply voltage and the reference potential.

In the present invention, the carrier frequency of the transmit signal amplified by the high-frequency power amplifier comprises about 2 GHz or so.

Further, in the present invention, the semiconductor integrated circuit device is used in communication equipment.

Advantageous effects obtained by a typical one of the inventions disclosed in the present application will be briefly explained as follows:

(1) A distortion characteristic at a high-frequency or RF power amplifier can be greatly improved.

(2) By virtue of the above (1), the performance capabilities of transmission characteristics of mobile communication equipment and communication equipment can be greatly improved.

DETAILED DESCRIPTION OF THE PREFERRED EMBODIMENTS

Preferred embodiments of the present invention will hereinafter be described in detail with reference to the accompanying drawings. Incidentally, the same components are given the same reference numerals in all the figures for describing the embodiments, and their repetitive description will therefore be omitted.

Figure 1:
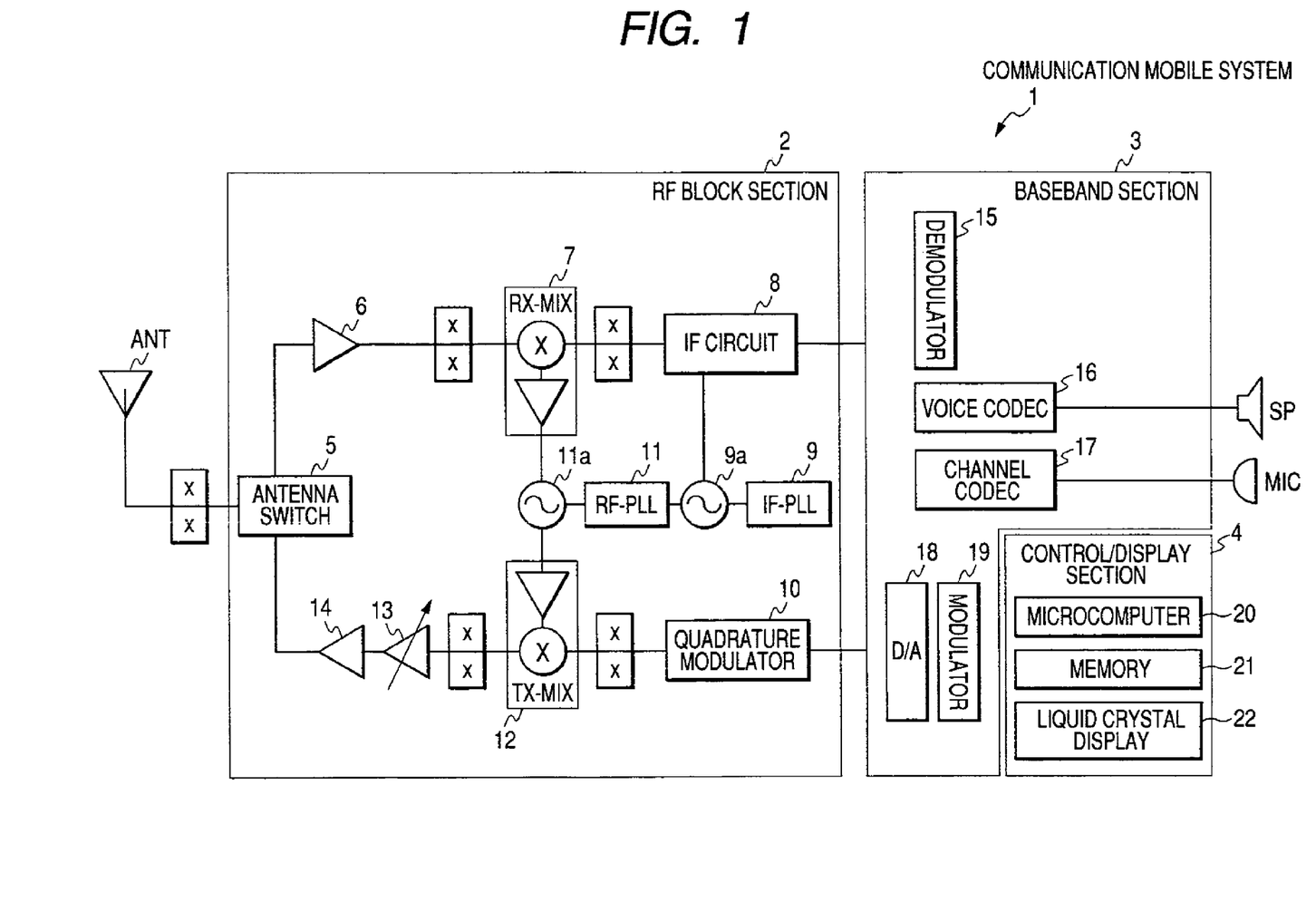
FIG. 1 is a block diagram of a communication mobile system according to one embodiment of the present invention.
Figure 2:
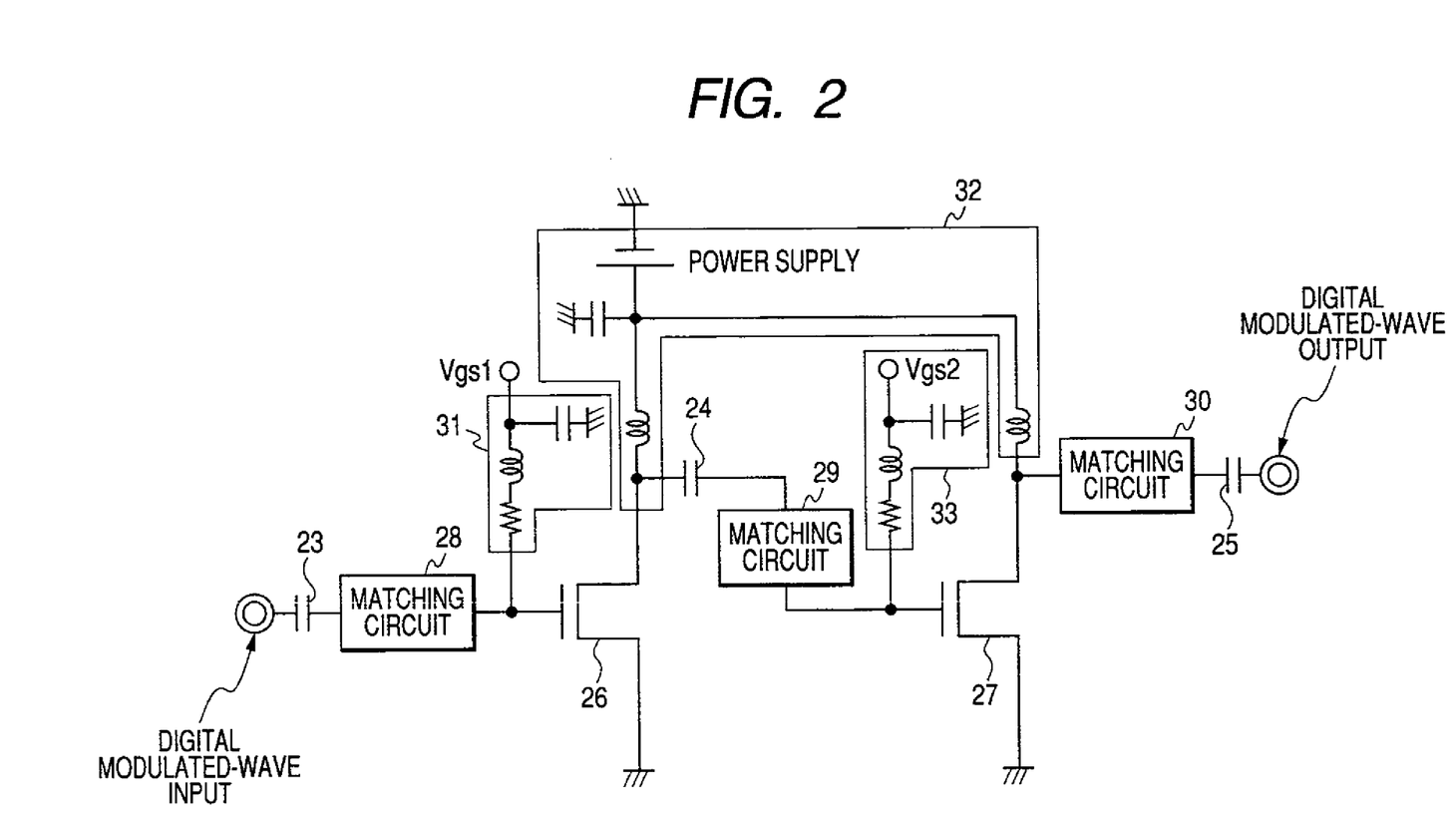
FIG. 2 is a circuit diagram showing one example of a power amplifier provided in the mobile communication system shown in FIG. 1.
Figure 3:
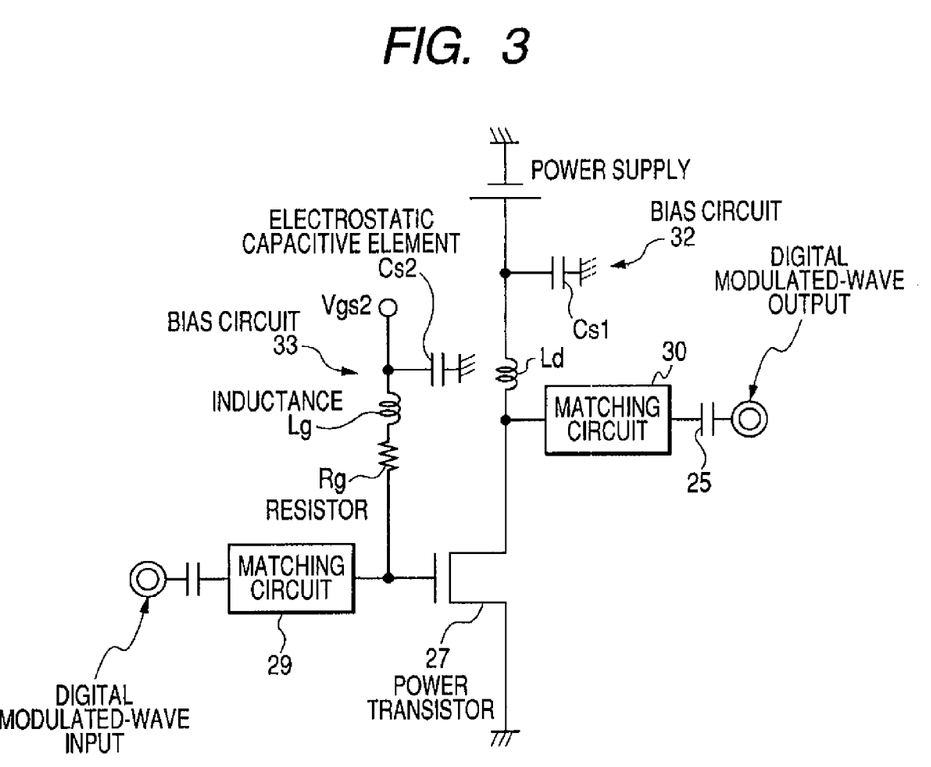
FIG. 3 is a circuit diagram illustrating a power transistor, a bias circuit and matching circuits in the power amplifier shown in FIG. 2.
Figure 4:
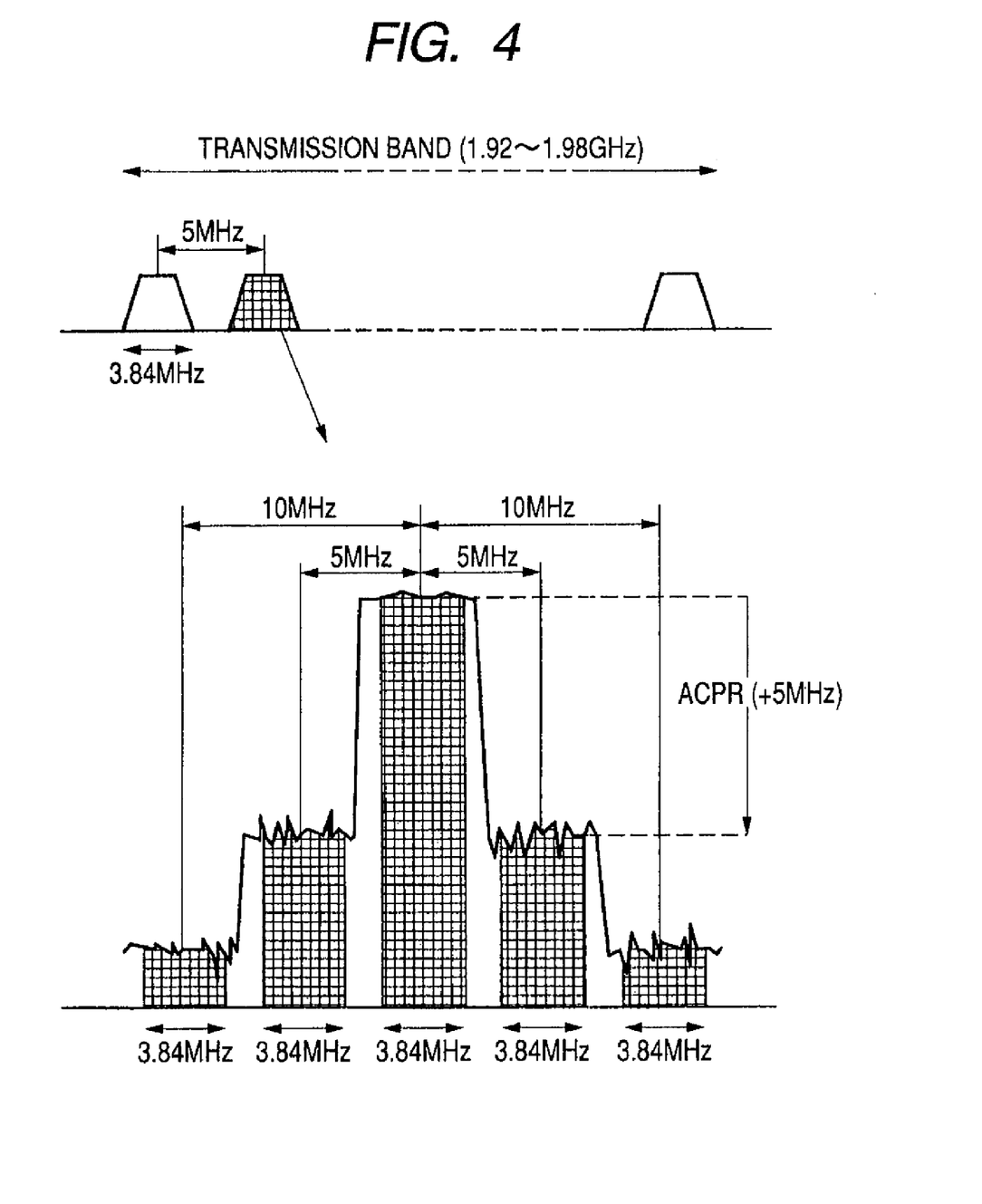
FIG. 4 is a diagram for describing transmit signals at WCDMA.
Figure 5:
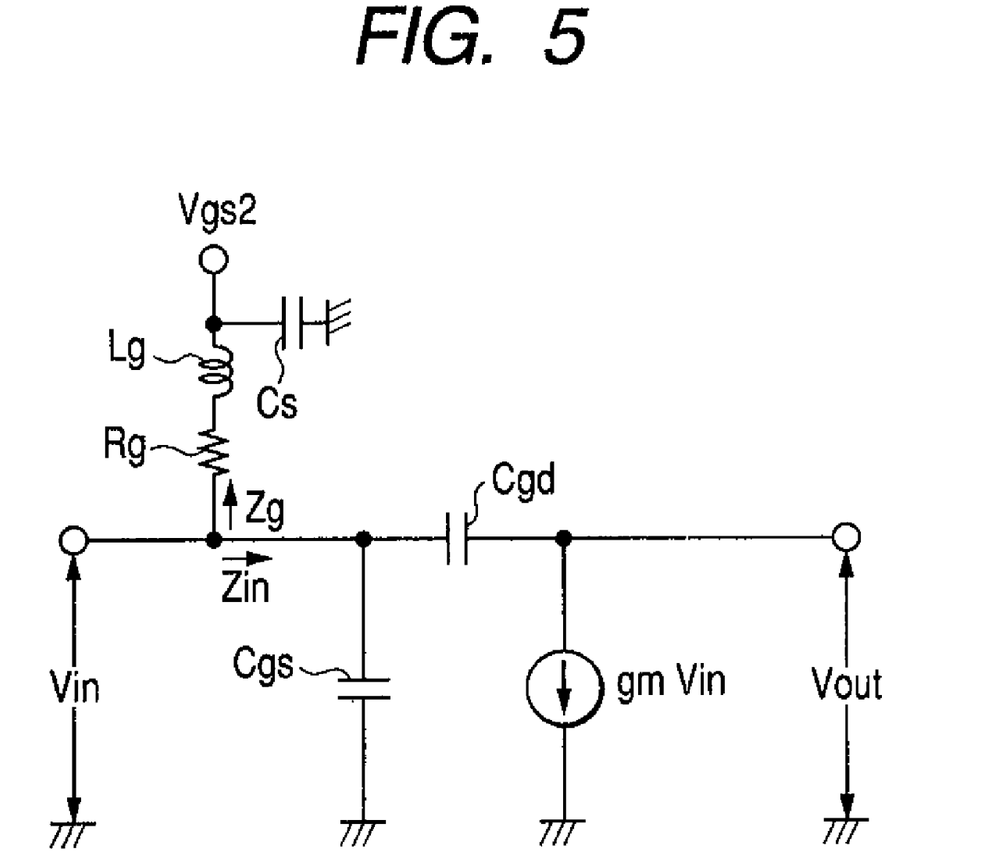
FIG. 5 is an equivalent circuit diagram of the power transistor shown in FIG. 3.
Figure 6A:
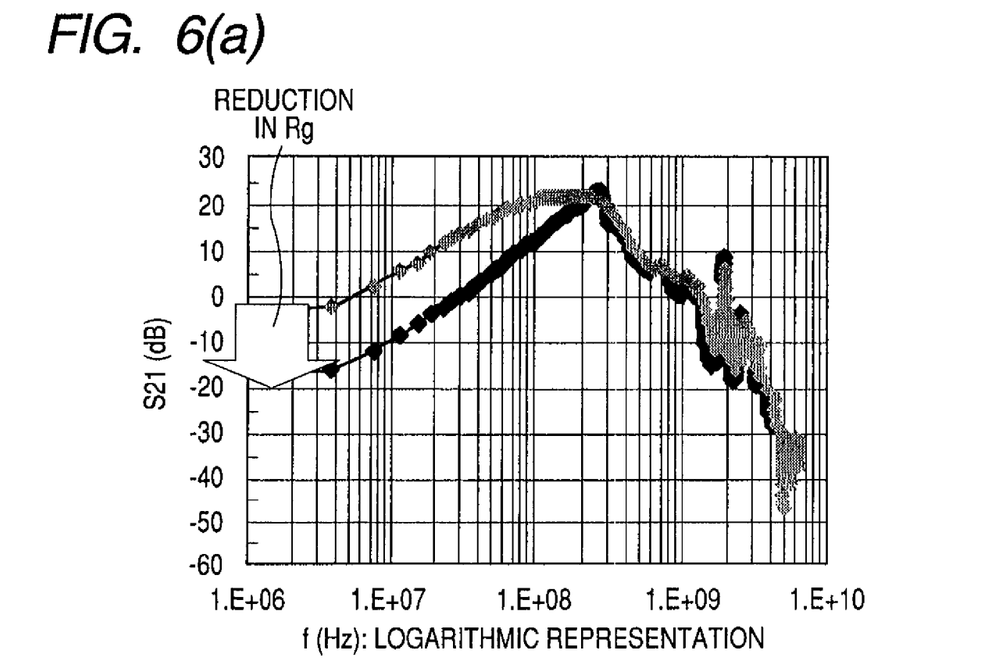
FIGS. 6(a) and 6(b) are explanatory diagrams showing the effect of reducing gain in a low-frequency band at the power transistor shown in FIG. 3.
Figure 6B:
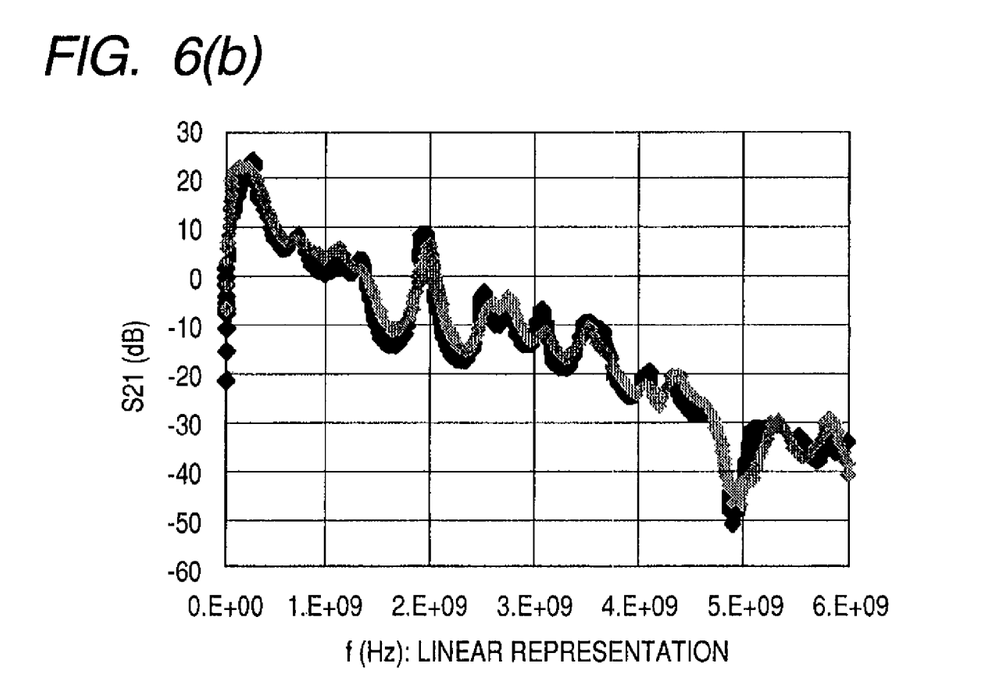
Figure 7A:
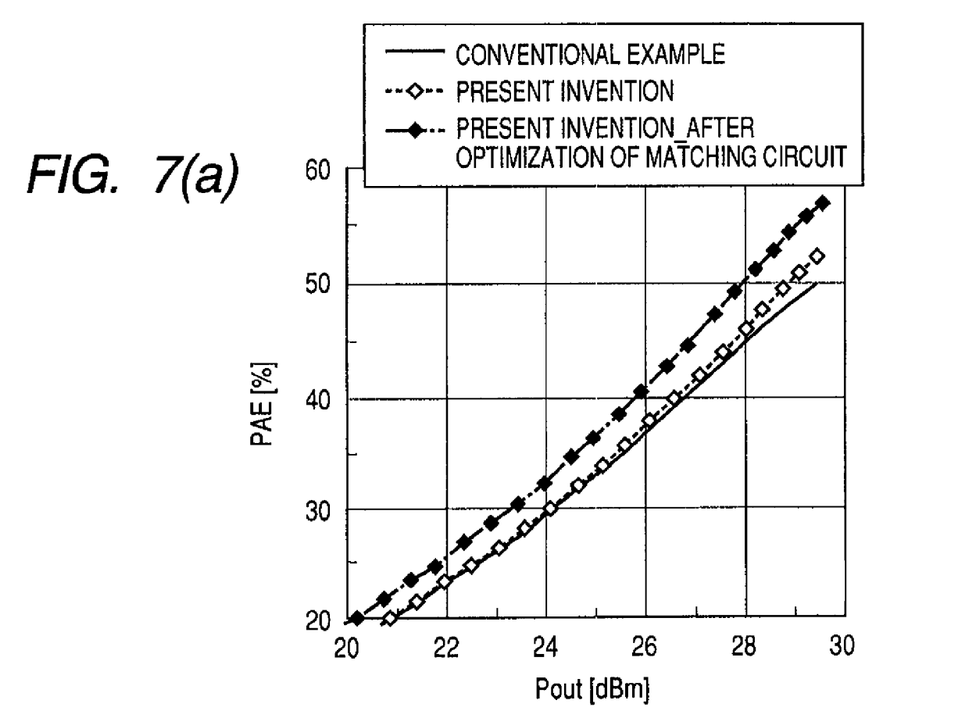
FIGS. 7(a) and 7(b) are explanatory diagrams illustrating one example of a characteristic evaluation result using a power transistor for WCDMA.
Figure 7B:
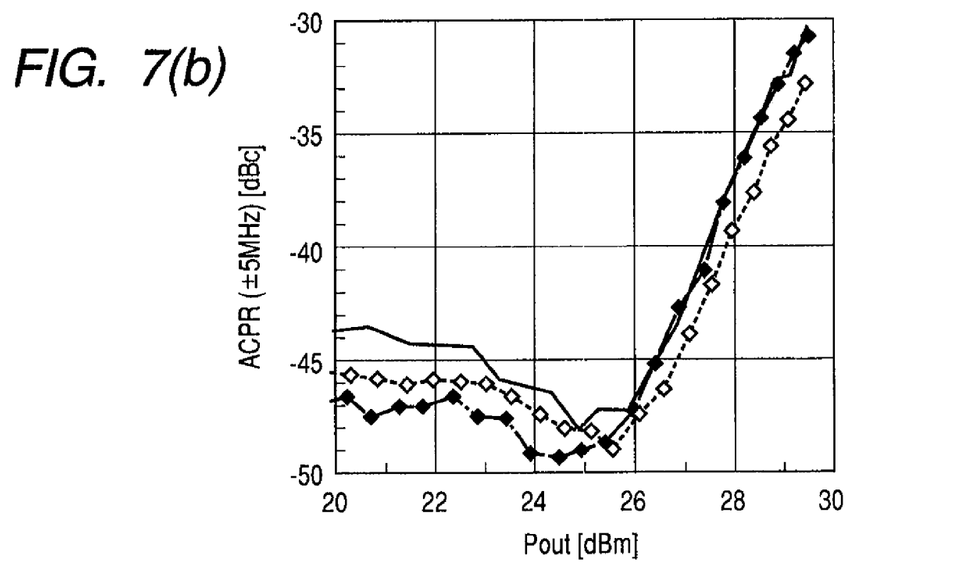
Figure 8:
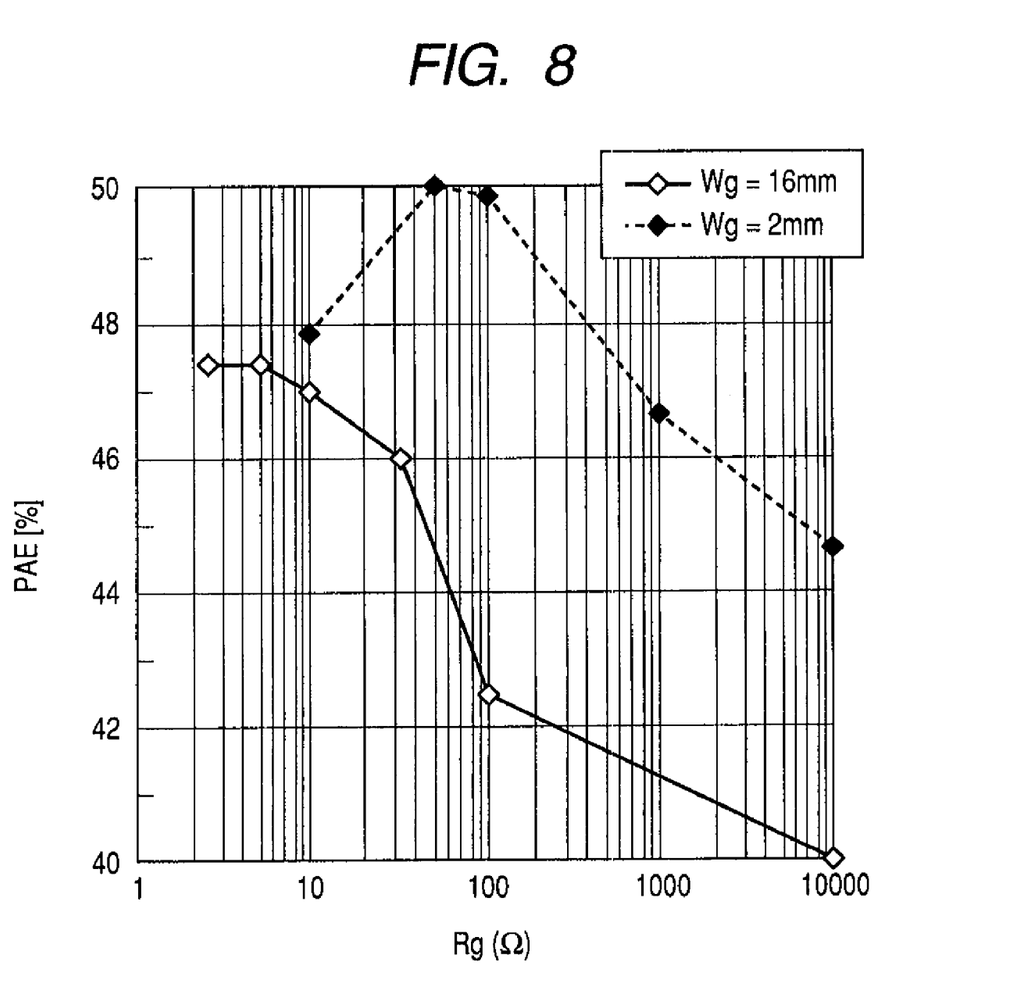
FIG. 8 is an explanatory diagram showing dependence on a resistor at the power transistor shown in FIG. 3.

FIG. 1 is a block diagram of a communication mobile system according to one embodiment of the present invention, FIG. 2 is a circuit diagram showing one example of a power amplifier provided in the mobile communication system shown in FIG. 1, FIG. 3 is a circuit diagram showing a power transistor, a bias circuit and matching circuits employed in the power amplifier shown in FIG. 2, FIG. 4 is a diagram for describing transmit signals at WCDMA, FIG. 5 is an equivalent circuit diagram of the power transistor shown in FIG. 3, FIGS. 6(a) and 6(b) are explanatory diagrams showing the effect of reducing gain in a low-frequency band at the power transistor shown in FIG. 3, FIGS. 7(a) and 7(b) are explanatory diagrams showing one example of a characteristic evaluation result using a power transistor for WCDMA, and FIG. 8 is an explanatory diagram illustrating dependence on a resistor at the power transistor shown in FIG. 3, respectively.

In the present embodiment, the communication mobile system (mobile communication equipment) 1 is a communication system such as a cellular phone or the like, which performs communications in accordance with a third-generation mobile communication system such as WCDMA or the like.

As shown in FIG. 1, the communication mobile system 1 comprises an RF block section (semiconductor integrated circuit device) 2, a baseband section 3 and a control/display section 4, etc.

The RF block section 2 comprises an antenna switch 5, a low-noise amplifier 6, a reception mixer 7, an IF (Intermediate Frequency) circuit 8, an IF-PLL 9, an IF oscillator 9a, a quadrature modulator 10, an RF-PLL 11, an RF-oscillator 11a, a transmission mixer 12, an AGC (Automatic Gain Control) amplifier 13 and a power amplifier (high-frequency or RF power amplifier) 14, etc.

The baseband section 3 comprises a demodulator 15, a voice codec 16, a channel codec 17, a D/A (Digital/Analog) converter 18 and a modulator 19, etc. The control/display section 4 comprises a microcomputer 20, a memory 21 and a liquid crystal display 22, etc.

A signal received by an antenna ANT is amplified by the low-noise amplifier 6 through the antenna switch 5. Subsequently, the so-amplified signal is led to the baseband section 3 by the reception mixer 7 as a second intermediate frequency ranging from, for example, about 150 MHz to 250 MHz, where it is demodulated.

A voice-digitized signal is converted into an analog signal by the D/A converter 18 of the baseband section 3, which in turn is led to the RF block section 2 as an I signal/Q signal, followed by being modulated to an IF frequency by the quadrature modulator 10 and then converted to a transmit signal by the transmission mixer 12, after which it is amplified by the AGC amplifier 13.

Subsequently, the so-processed signal is amplified by the power amplifier 14 and transmitted from the antenna ANT through the antenna switch 5. The reception mixer 7 and the transmission mixer 12 are supplied with a local signal by a synthesizer constituted of the oscillator and RF-PLL 11.

FIG. 2 is a circuit diagram showing one example of the power amplifier 14.

The power amplifier 14 is of a linear amplifier and comprises electrostatic capacitive elements 23 through 25, a transistor 26 for a driver, a power transistor (transistor) 27, matching circuits 28 through 30 and bias circuits 31 through 33.

A digital modulated-wave outputted from the AGC amplifier 13 is connected to one connecting part of the electrostatic capacitive element 23 so as to be inputted thereto. An input part of the matching circuit 28 is connected to the other connecting part of the electrostatic capacitive element 23.

The bias circuit 31 and the gate of the transistor 26 are respectively connected to an output part of the matching circuit 28. The bias circuit (first bias circuit) 32 and one connecting part of the electrostatic capacitive element 24 are respectively connected to one connecting part (drain) of the transistor 26.

An input part of the matching circuit 29 is connected to the other connecting part of the electrostatic capacitive element 24. The bias circuit (second bias circuit) 33 and the gate of the power transistor 27 are respectively connected to an output part of the matching circuit 29.

Each of the transistor 26 and the power transistor 27 comprises, for example, a MOSFET (Metal Oxide Semiconductor Field Effect Transistor).

Input parts of the bias circuit 32 and the matching circuit 30 are respectively connected to one connecting part (drain) of the power transistor 27. A reference potential VSS is connected to the other connecting parts (sources) of the transistor 26 and the power transistor 27 respectively.

One connecting part of the electrostatic capacitive element 25 is connected to an output part of the matching circuit 30. The other connecting part of the electrostatic capacitive element 25 serves as a part for outputting a digital modulated-wave at the power transistor 27. The output part is connected to the antenna switch 5 such that the digital modulated-wave is outputted thereto.

The matching circuits 28 through 30 optimize impedance matching with a connected external circuit and perform matching so as to satisfy input-output characteristics.

FIG. 3 shows the power transistor 27 at the power amplifier 14 of FIG. 2 and its peripheral circuits.

The bias circuit 32 is connected to one connecting part of the power transistor 27. The bias circuit 32 is constituted of an inductance Ld and an electrostatic capacitive element Cs1. A power supply voltage is connected to one connecting part of the inductance Ld and one connecting part of the electrostatic capacitive element Cs1 respectively.

One connecting part of the power transistor 27 and an input part of the matching circuit 30 are respectively connected to the other connecting part of the inductance Ld. The reference potential VSS is connected to the other connecting part of the electrostatic capacitive element Cs1.

The bias circuit 33 connected to the gate of the power transistor 27 comprises an inductance Lg constituted of a microsplit line or the like, an electrostatic capacitive element Cs2 and a resistor (gate resistor) Rg.

For example, a power supply voltage (bias power supply voltage) Vgs2 set so as to become an arbitrary bias current by resistance division is connected to one connecting part of the electrostatic capacitive element Cs2 and one connecting part of the inductance Lg so as to be applied to both parts. And the other connecting part of the resistor Rg is connected to the gate of the power transistor 27.

Here, in the bias circuit 33, the resistance value of the resistor Rg used as the gate resistor of the power transistor 27 is set so as to be substantially on the same order as the input impedance of the power transistor 27. When the input impedance of the power transistor 27 is on the order of about 10Ω or so, for example, the resistor Rg is set to about a few Ω to about 100Ω.

FIG. 4 is a diagram for describing transmit signals at WCDMA.

As shown above FIG. 4, WCDMA has a transmission band ranging from 1.92 GHz to 1.98 GHz. Transmit signals are provided every 5 MHz in the transmission band. In the detail of the transmit signals, the transmit signal is shaped in the form of such a rectangle as shown below FIG. 4. Leakage power at each of portions spaced ±5 MHz and ±10 MHz away from its center signal frequency influences each transmit signal adjacent to this transmit signal.

This leakage power is called "ACPR (Adjacent Channel Power Ratio). The difference between the transmit signal at its center and its adjacent transmit signal is expressed in a dB difference. The difference is represented with the end of dB marked with "c" like ACPR (+5 MHz)=−40 dBc, for example.

The leakage power is in a close relation to a distortion characteristic of the output (transmit signal) of the power transistor. The most important characteristic of WCDMA associated with the linear amplifier resides in that the leakage power is set to be less than or equal to a given value.

FIG. 5 shows an equivalent circuit of the power transistor 27 in FIG. 3.

Determining the impedance Zg of the bias circuit 33 using this figure yields the following. The impedance Zin of the power transistor is also shown in conjunction with it.

$$Zg = Rg + j\omega Lg + 1/(j\omega Cs) \quad (1)$$
(Cs is negligible because it is sufficiently large.)
$$= Rg + j\omega Lg$$

$$Zin = 1/(j\omega Cgs + j\omega Cgd) \quad (2)$$

(where Cgs: gate-to-source capacitance (gate capacitance), and Cgd: gate-to-drain capacitance (feedback capacitance))

Here, for example, an Si-MOSFET most suitable as the power transistor for WCDMA has a gate width of about 16 mm or so, and the value of (Cgs+Cgd) becomes about 13 pF or so.

Calculating Zin with the center frequency at WCDMA as 1.95 MHz yields Zin=6.3Ω.

Thus, when the frequency of an input signal of the power transistor 27 is given as follows where the resistor Rg and the inductance Lg at the bias circuit 33 are Rg=6.3Ω and Lg=10 nH respectively:

(1) when the frequency of the signal is f=1.95 GHz, Zg and Zin respectively result in Zg=6.3+j122Ω and Zin=6.3Ω, and (2) when the frequency related to distortion of the output of the power transistor 27 is f=10 MHz, Zg and Zin result in Zg=6.3+j0.6Ω and Zin=j1220Ω.

Consequently, since Zg>>Zin upon (1) f=1.95 GHz, the input signal is mostly inputted to the gate of the power transistor and is not inputted to the bias circuit. Further, Zg is dominant in inductance component (122Ω), the loss of the input signal does not occur. Accordingly, no influence is exerted on the high-frequency characteristic per se of the input signal.

On the other hand, since Zin>>Zg upon (1) f=10 MHz, the input signal mostly enters the bias circuit 33 and is not inputted to the gate of the power transistor 27. Further, since Zg is dominant in resistive component (6.3Ω), a loss occurs in the input signal, so that the gain of the power transistor 27 is suppressed.

The above results are summarized as follows:

Reducing the resistor Rg up to substantially the same order as the input impedance of the power transistor makes it possible to greatly suppress the gain of the power transistor at a low-frequency band ranging from 5 MHz to 10 MHz, for example.

Thus, since a signal component (leakage power) that appears in the neighborhood (frequency of transmit signal ±5 MHz to 10 MHz) of an output signal, i.e., a transmit-signal frequency by intermodulation of the above low-frequency band and the input signal can be greatly improved, a power FET having such a configuration that it is low in distortion and suitable for the linear amplifier can be obtained.

FIGS. 6(a) and 6(b) are explanatory diagrams showing the effect of reducing the gain at the low-frequency band, of the power transistor 27 when the resistor Rg of the bias circuit 33 is changed to 10 Ω/10 kΩ respectively.

In FIGS. 6(a) and 6(b), the horizontal axis indicates the frequency f (Hz) of the transmit signal, and the vertical axis indicates the gain (dB) of the power transistor 27. FIG. 6(a) is a graph in which the frequency f is expressed in logarithm, and FIG. 6(b) is a graph in which the frequency f is shown in linear representation. A black line in each figure indicates where the resistor Rg in the bias circuit 33 is 10Ω, and a halftone line indicates where the resistor Rg is 10 kΩ.

In this case, it is understood that as is apparent from a comparison between the case in which the resistor Rg is 10Ω and the case in which the resistor Rg is 10 kΩ, the gain at the low-frequency band (about 5 MHz to 10 MHz) is greatly reduced as shown in the figure.

FIGS. 7(a) and 7(b) are explanatory diagrams showing one example of the result of characteristic evaluations conducted using an actual power transistor 27 for WCDMA.

In FIG. 7(a), the horizontal axis indicates the output Pout (dBm) of the power transistor 27, and the vertical axis indicates PAE (power load efficiency) (%) of the power transistor 27. In FIG. 7(b), the horizontal axis indicates the output Pout (dBm) of the power transistor 27, and the vertical axis indicates ACPR (dBc) of the power transistor 27.

Further, a solid line in each figure indicates where the resistor Rg is set to about 5 kΩ to 10 kΩ, and a dotted line in each figure indicates where the resistance value of the resistor Rg is set to be substantially the same order as the input impedance of the power transistor 27.

Thus, when the resistance value of the resistor Rg is set to be substantially the same order as the input impedance of the power transistor 27, a 2 dB-improvement is made at a distortion component when Pout=27.5 dBm (see FIG. 7(b)).

Further, when the conditions for the matching circuits 29 and 30 are optimized in the circuit diagram of FIG. 3 in such a manner that the conventional example (solid line in FIG. 7(a)) and the present invention (dotted line in FIG. 7(b)) become identical in distortion component, an improvement in PAE reaching even 5% or so (indicated by a dashed line in FIG. 7(a)) is obtained.

FIG. 8 is an explanatory diagram showing dependence of the gate width of the power transistor on the resistor Rg.

In FIG. 8, the horizontal axis indicates the resistance value (Ω) of the resistor Rg, and the vertical axis indicates PAE (%) of the power transistor 27. A solid line indicates where the gate width Wg of the power transistor 27 is 16 mm, and a dotted line indicates where the gate width Wg of the power transistor 27 is 2 mm.

In this case, the input impedance of the power transistor 27 is about 6.3Ω or so where the gate width Wg of the power transistor 27 is 16 mm, whereas when the gate width Wg of the power transistor 27 is 2 mm, its input impedance becomes about 50Ω or so.

It is understood as shown in the figure that when the gate width Wg of the power transistor 27 is 1 mm, PAE becomes the maximum value where the resistor Rg is about 5Ω or so, whereas when the gate width Wg of the power transistor 27 is 2 mm, PAE becomes the maximum value where the resistor Rg is about 50Ω or so.

As is understood even from the figure, ACPR can greatly be improved by setting the resistor Rg to substantially the same order as the input impedance of the power transistor 27.

Thus, according to the present embodiment, the leakage power at the power transistor 27 can greatly be improved. It is therefore possible to obtain the power amplifier 14 low in distortion and suitable for the linear amplifier.

While the invention made above by the present inventors has been described specifically on the basis of the preferred embodiments, the present invention is not limited to the embodiments referred to above. It is needless to say that various changes can be made thereto without the scope not departing from the gist thereof.

Although, for example, the bias circuit 33 is configured so that the inductance Lg and the resistor Rg are directly connected between the power supply voltage Vgs2 and the gate of the power transistor in the present embodiment, no particular limitation is imposed on the order in which the inductance Lg and the resistor Rg are connected.

Figure 9:
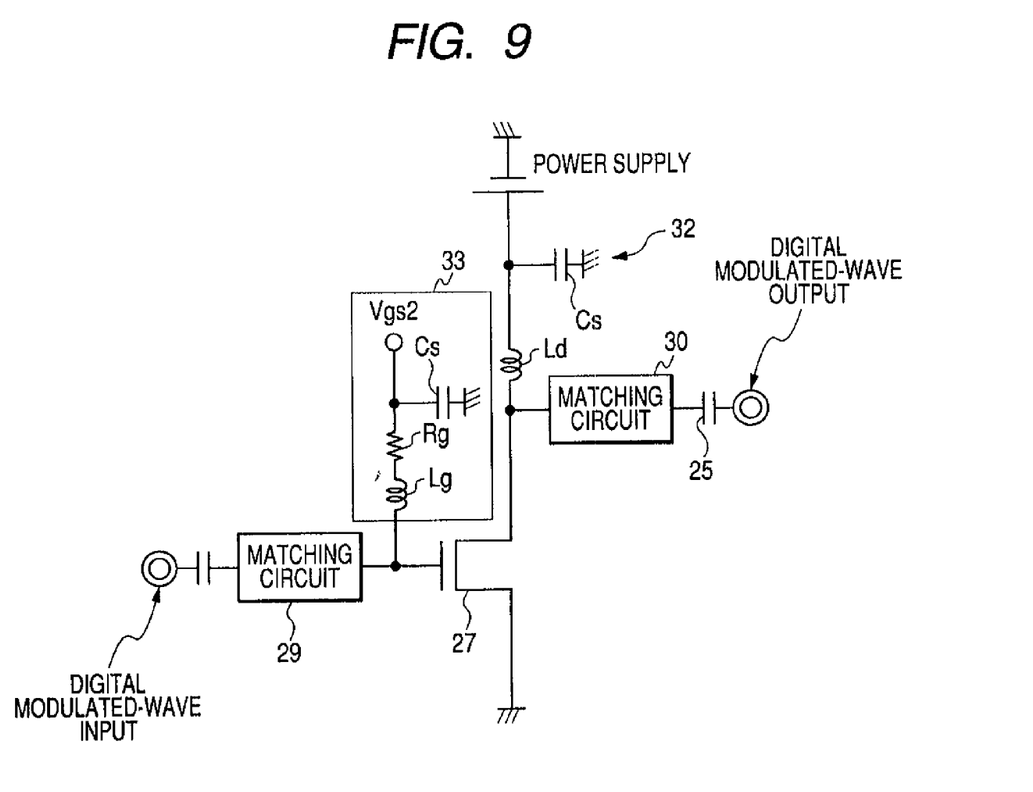
FIG. 9 is a circuit diagram illustrating one example of a bias circuit provided in a power amplifier according to one embodiment of the present invention.

There may be adopted such a configuration that the order of series-connecting an inductance Lg and a resistor Rg is made opposite to the case shown in FIG. 3 in such a manner that a power supply voltage Vgs2 is connected to one connecting part of the resistor Rg so as to be supplied thereto, and the gate of a power transistor 27 is connected to the other connecting part of the inductance Lg as shown in FIG. 9, for example.

Even though the order of connecting the inductance Lg and the resistor Rg is set in reverse in this way, the advantageous effect of the invention remains unchanged as is apparent from the equation (1) employed in the present embodiment.

Although the present embodiment has explained where the present invention is applied to the communication mobile equipment such as the cellular phone, the present invention can be applied to a power amplifier employed in a base station (communication equipment), for example.

The present invention relates to a technique for amplifying a transmit signal, which is employed in mobile communication equipment.

What is claimed is:

1. A semiconductor integrated circuit device for mobile communication equipment, comprising a high-frequency power amplifier,
    said high-frequency power amplifier including:
    a transistor having a gate inputted with a transmit signal, a source connected with a reference potential and a drain outputting a signal of said high-frequency power amplifier obtained by amplifying said transmit signal;
    a first bias circuit supplying a first bias voltage to said drain; and
    a second bias circuit supplying a second bias voltage to said gate, including a gate resistor and an inductance series-connected between a second bias power supply voltage and said gate,
    wherein an impedance value of said inductance is higher than an impedance value of said gate resistor for a first predetermined frequency range of said transmit signal, and said impedance value of said inductance is lower than said impedance value of said gate resistor for a second predetermined frequency range of said transmit signal,
    wherein said second predetermined frequency range is less than said first predetermined frequency range;
    wherein said first predetermined frequency range is in the order of GHz, and wherein said second predetermined frequency range is in the order of MHz; and
    wherein said gate resistor has a resistance value of substantially the same order as an input impedance of the transistor at said first predetermined frequency range, which is determined by the sum of a gate capacitance of the transistor and a feedback capacitance thereof.

2. A semiconductor integrated circuit device for mobile communication equipment, comprising a high-frequency power amplifier,
    said high-frequency power amplifier including:
    a transistor having a gate inputted with a transmit signal, a source connected with a reference potential and a drain outputting a signal of said high-frequency power amplifier obtained by amplifying said transmit signal;
    a first bias circuit supplying a first bias voltage to said drain; and
    a second bias circuit supplying a second bias voltage to said gate, including a gate resistor and an inductance series-connected between a second bias power supply voltage and said gate,
    wherein an impedance value of said inductance is higher than an impedance value of said gate resistor for a first predetermined frequency range of said transmit signal, and said impedance value of said inductance is lower than said impedance value of said gate resistor for a second predetermined frequency range of said transmit signal, wherein said second predetermined frequency range is less than said first predetermined frequency range;

wherein said first predetermined frequency range is approximately 2 GHz, and wherein said second predetermined frequency range is approximately 10 MHz; and wherein said gate resistor has a resistance value of approximately the same order as an input impedance of the transistor at said first predetermined frequency range, which is determined by the sum of a gate capacitance of the transistor and a feedback capacitance thereof.

3. The semiconductor integrated circuit device according to claim 1, wherein said gate resistor has a resistance value of less than or equal to 100Ω or so.

4. The semiconductor integrated circuit device according to claim 2, wherein said gate resistor has a resistance value of less than or equal to approximately 100Ω.

5. The semiconductor integrated circuit device according to claim 3, wherein said second bias circuit has an electrostatic capacitive element connected between said second bias power supply voltage and said reference potential.

6. The semiconductor integrated circuit device according to claim 4, wherein said second bias circuit has an electrostatic capacitive element connected between said second bias power supply voltage and said reference potential.

* * * * *